(12) United States Patent
Yen et al.

(10) Patent No.: US 9,985,078 B2
(45) Date of Patent: May 29, 2018

(54) DISPLAY PANEL

(71) Applicants: Chung-Wen Yen, Miao-Li County (TW); Chao-Hsiang Wang, Miao-Li County (TW)

(72) Inventors: Chung-Wen Yen, Miao-Li County (TW); Chao-Hsiang Wang, Miao-Li County (TW)

( * ) Notice: Subject to any disclaimer, the term of this patent is extended or adjusted under 35 U.S.C. 154(b) by 0 days. days.

(21) Appl. No.: 15/671,526

(22) Filed: Aug. 8, 2017

(65) Prior Publication Data
US 2018/0047792 A1     Feb. 15, 2018

(30) Foreign Application Priority Data
Aug. 9, 2016 (CN) .......................... 2016 1 0644922

(51) Int. Cl.
| H01L 51/52 | (2006.01) |
| H05B 33/02 | (2006.01) |
| H01L 27/32 | (2006.01) |
| H01L 51/10 | (2006.01) |
| H01L 51/56 | (2006.01) |
| G02F 1/1333 | (2006.01) |

(52) U.S. Cl.
CPC ...... *H01L 27/322* (2013.01); *G02F 1/133345* (2013.01); *H01L 51/102* (2013.01); *H01L 51/56* (2013.01)

(58) Field of Classification Search
CPC ..... H01L 27/322; H01L 51/102; H01L 51/56; G02F 1/133345
See application file for complete search history.

(56) References Cited

U.S. PATENT DOCUMENTS

| 2001/0013913 A1* | 8/2001 | Young | G02F 1/136227 349/113 |
| 2009/0153761 A1* | 6/2009 | Park | G02F 1/134363 349/43 |
| 2011/0157252 A1* | 6/2011 | Yamazaki | G02F 1/133555 345/690 |
| 2014/0306241 A1* | 10/2014 | Hirakata | H01L 51/5209 257/79 |
| 2015/0351168 A1* | 12/2015 | Yasumoto | B32B 7/12 428/216 |
| 2016/0190218 A1* | 6/2016 | Jeong | H01L 51/5221 257/40 |
| 2016/0300894 A1* | 10/2016 | Park | H01L 27/3246 |

* cited by examiner

*Primary Examiner* — Donald Raleigh
(74) *Attorney, Agent, or Firm* — McClure, Qualey & Rodack, LLP

(57) ABSTRACT

A display panel includes a substrate, a color filter layer, a first insulating layer, a first conductive layer, a second insulating layer, a display layer, and a second conductive layer. The substrate includes a surface, wherein a first direction is perpendicular to the surface. The first insulating layer includes a first electrode, a second electrode, and a third electrode. The second insulating layer includes a first protrusion and a second protrusion disposed between the first and second electrodes, and a third protrusion and a fourth protrusion disposed between the second and third electrodes. The second conductive layer includes a first reflection portion disposed between the first and second protrusions, and a second reflection portion disposed between the third and fourth protrusions. A first distance between the first reflection portion and the surface is different from a second distance between the second reflection portion and the surface.

18 Claims, 5 Drawing Sheets

DISPLAY PANEL

CROSS REFERENCE TO RELATED APPLICATIONS

This Application claims priority of China Patent Application No. 201610644922.5, filed on Aug. 9, 2016, the entirety of which is incorporated by reference herein.

BACKGROUND

Technical Field

The disclosure relates to display panels, and in particular to a display panel with insulating layers.

Description of the Related Art

In general, an organic light-emitting diode is a self light-emitting element that emits light by electrically exciting an organic compound. Recently, organic light-emitting diodes have received much attention and been used in flat-panel displays, TV screens, computer monitors, and portable electronic device screens. When used in displays, organic light-emitting diodes provide multiple advantages, such as a self light-emitting ability and wider viewing angle than flat-panel displays.

Because of advantages that include having a high speed of response, being power-saving, and being lightweight, thin film transistor-organic light-emitting diode (TFT-OLED) displays have entered the mainstream of development in the market. There are two main methods for manufacturing TFT-OLED displays: One is a technique that applies a low temperature poly-silicon (LTPS) thin film transistor, and the other one is a technique that applies a metal oxide thin film transistor.

However, existing display panels are not satisfactory in every respect. Therefore, a display panel that may further increase the light-utilization efficiency and display quality is still required in the industry.

BRIEF SUMMARY

Some embodiments of the disclosure provide a display panel. The display panel includes a substrate, a color filter layer disposed on the substrate, a first insulating layer disposed on the color filter layer, a first conductive layer disposed on the first insulating layer, a second insulating layer disposed on the first conductive layer, a display layer disposed on the second insulating layer, and a second conductive layer disposed on the display layer. In the display panel, the substrate includes a surface, wherein a first direction is perpendicular to the surface. The first conductive layer includes a first electrode, a second electrode, and a third electrode, wherein the third electrode is disposed between the first electrode and the second electrode, and the first electrode, the second electrode, and the third electrode are separated from each other. The second conductive layer includes a first reflection portion disposed between the first protrusion and the second protrusion, and a second reflection portion disposed between the third protrusion and the fourth protrusion. The second insulating layer includes a first protrusion and a second protrusion disposed between the first electrode and the second electrode, and a third protrusion and a fourth protrusion disposed between the second electrode and the third electrode. A first distance between the first reflection portion and the surface of the substrate in the first direction is different from a second distance between the second reflection portion and the surface of the substrate in the first direction.

To clarify the features and advantages of the present disclosure, a detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
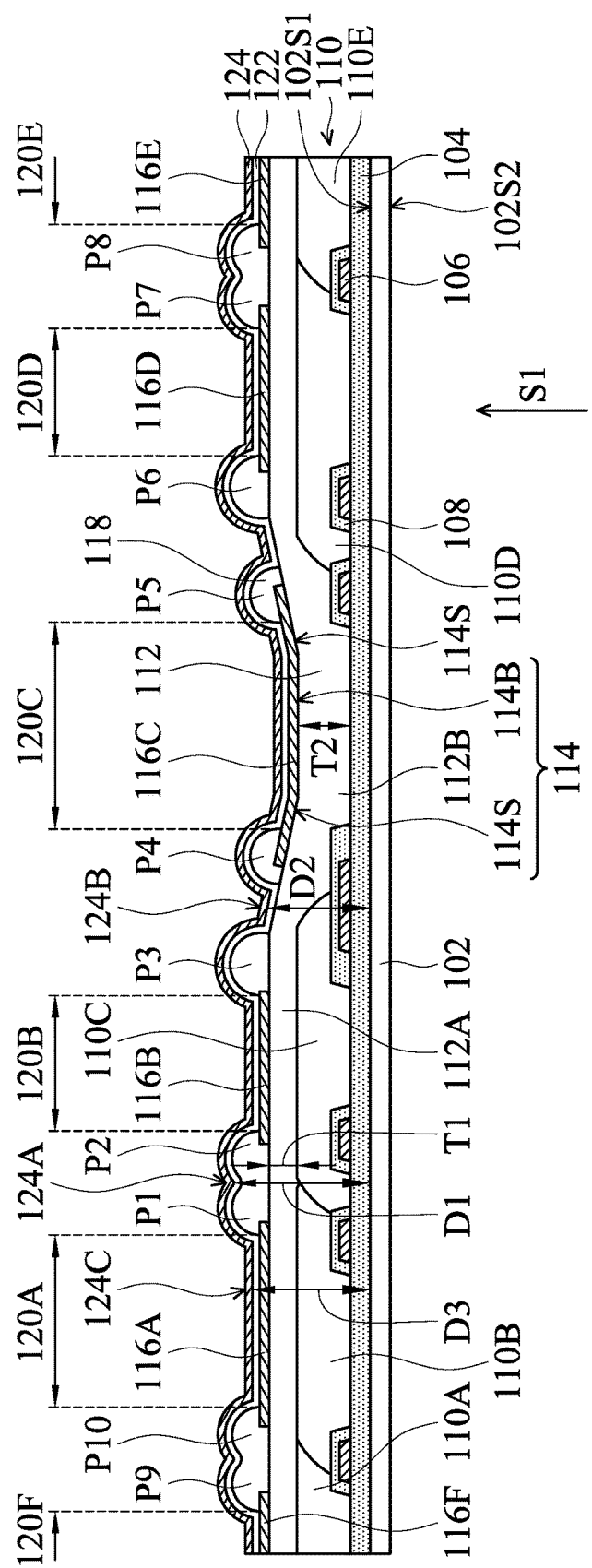
FIG. 1 is a cross-sectional view of a display panel in accordance with some embodiments.

The display panels in some embodiments of the present disclosure are described in detail in the following description. It should be appreciated that the following detailed description provides various embodiments and examples in order to perform various patterns of the present disclosure. The specific elements and configurations described in the following detailed description are set forth in order to clearly describe the present disclosure. It will be apparent that the exemplary embodiments set forth herein are used merely for the purpose of illustration, and the inventive concept may be embodied in various forms without being limited to those exemplary embodiments. In addition, the drawings of different embodiments may use repeated numerals or marks. Those repetitions are merely in order to clearly describe the present disclosure. However, the use of repeated numerals in the drawings of different embodiments does not suggest any correlation between different embodiments and/or configurations. In addition, in this specification, expressions such as "first material layer disposed on/over/above/under a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions may be used. For example, "lower", "bottom", "higher" or "top" are used to describe the position of one element relative to another. It should be appreciated that if a device is flipped upside down, an element that is "lower" will become an element that is "higher".

The terms "about", "substantially" and "approximately" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about", "substantially", or "approximately".

It should be understood that, although the terms "first", "second", "third" etc. may be used herein to describe various elements, components, regions, layers and/or portions, and these elements, components, regions, layers, portions and/or sections should not be limited by these terms. These terms are only used to distinguish one element, component, region, layer, or portion. Thus, a first element, component, region, layer or portion discussed below could be termed a second element, component, region, layer or portion without departing from the teachings of the present disclosure.

Unless defined otherwise, all the terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

This description of the exemplary embodiments is intended to be read in connection with the accompanying drawings, which are to be considered part of the entire written description. It should be appreciated that the drawings are not drawn to scale. The shape and the thickness of embodiments may be exaggerated in the drawings to clarify the features of the present disclosure. In addition, structures and devices are shown schematically in order to clarify the features of the present disclosure.

In some embodiments of the present disclosure, relative terms such as "downwards," "upwards," "horizontal," "vertical,", "below," "above," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are in contact with one another either directly or indirectly, wherein there are other structures disposed between both the structures, unless expressly described otherwise. These relative terms also include the relationships wherein both structures are movable or rigid attachments.

It should be noted that the term "thickness" is meant to "the minimum thickness" of an object if the present disclosure does not particularly mention another definition.

Referring to FIG. 1, FIG. 1 is a cross-sectional view of a display panel 100 in accordance with some embodiments. As shown in FIG. 1, in accordance with some embodiments, the display panel 100 includes a substrate 102, and the substrate 102 may include a transparent substrate, for example, a glass substrate, a ceramic substrate, a plastic substrate, or any other suitable substrate. In some embodiments, the substrate 102 may be a thin-film transistor substrate. In addition, the substrate 102 has a top surface 102S1 and a bottom surface 102S2, wherein a first direction S1 is perpendicular to the top surface 102S1 or the bottom surface 102S2.

Referring to FIG. 1 again, in accordance with some embodiments, an insulating layer 104 is disposed on the top surface 102S1 of the substrate 102. The insulating layer 104 may be silicon nitride, silicon dioxide, or silicon oxynitride. The material of the insulating layer 104 may be formed by chemical vapor deposition (CVD) or spin-on coating. The CVD may be, for example, low pressure chemical vapor deposition (LPCVD), low temperature chemical vapor deposition (LTCVD), rapid temperature chemical vapor deposition (RTCVD), plasma enhanced chemical vapor deposition (PECVD), atomic layer deposition (ALD), or another commonly used method.

Referring to FIG. 1, a metal layer 106 is disposed on the insulating layer 104 in accordance with some embodiments. The material of the metal layer 106 may be Cu, Al, Mo, W, Au, Cr, Ni, Pt, Ti, Ir, Rh, an alloy thereof, a combination thereof, or another metal material with good conductivity. The metal layer 106 may be formed by the aforementioned CVD, sputtering, resistance heating evaporation, electron beam evaporation, or any other suitable deposition method.

In some embodiments, the metal layer 106 may be data lines. However, in some other embodiments, the metal layer 106 may be gate lines. In some other embodiments, the metal layer 106 may be power lines.

Referring to FIG. 1, an insulating layer 108 is disposed on the metal layer 106 in accordance with some embodiments. The insulating layer 108 may be silicon nitride, silicon dioxide, or silicon oxynitride. The insulating layer 108 may be formed by CVD or spin-on coating. In addition, the insulating layer 108 covers the metal layer 106.

Referring to FIG. 1, the display panel 100 includes color filter layers 110 disposed on the insulating layer 104 and the insulating layer 108 (or on the top surface 102S1 of the substrate 102). The color filter layers 110, from left to right, sequentially include a first color filter portion 110A, a second color filter portion 110B, a third color filter portion 110C, a fourth color filter portion 110D and a fifth color filter portion 110E.

In some embodiments, the first color filter portion 110A is a red color filter portion. The second color filter portion 110B is a green color filter portion. The third color filter portion 110C is a blue color filter portion. The fourth color filter portion 110D is a red color filter portion. The fifth color filter portion 110E is a green color filter portion.

In some other embodiment, the first color filter portion 110A, the second color filter portion 110B, the third color filter portion 110C, the fourth color filter portion 110D, the fifth color filter portion 110E can individually be one of a red color filter portion, a green color filter portion, and a blue color filter portion.

Furthermore, in some embodiments, as shown in FIG. 1, the first color filter portion 110A is in direct contact with the second color filter portion 110B, the second color filter portion 110B is in direct contact with the third color filter portion 110C, and the fourth color filter portion 110D is in direct contact with the fifth color filter portion 110E. However, the third color filter portion 110C does not come in direct contact with the fourth color filter portion 110D, and the region between the third color filter portion 110C and the fourth color filter portion 110D corresponds to the subsequent white light emitting region.

Referring to FIG. 1, the display panel 100 further includes a first insulating layer 112 disposed on the color filter layers 110, the insulating layer 104 and the insulating layer 108. The material of the first insulating layer 112 may include organic insulating materials, for example, photoacryl. The first insulating layer 112 may be formed by CVD, spin-on coating, sputtering, evaporation, or any other suitable method.

As shown in FIG. 1, the first insulating layer 112 includes a second insulating portion 112B has a recess surface 114 between the third color filter portion 110C and the fourth color filter portion 110D in accordance with some embodiments. The recess surface 114 has a first middle part 114B and two inclined parts 114S disposed at two opposite sides of the first middle part 114B.

Referring to FIG. 1, the display panel 100 further includes a first conductive layer 116 disposed on the first insulating layer 112, wherein the first conductive layer 116 includes a first electrode 116A, a second electrode 116B, a third electrode 116C, a fourth electrode 116D, a fifth electrode 116E and a sixth electrode 116F. In more detail, in the display panel 100 shown in FIG. 1, from left to right, there are respectively the sixth electrode 116F, the first electrode 116A, the second electrode 116B, the third electrode 116C, the fourth electrode 116D and the fifth electrode 116E. For example, in some embodiments, the first electrode 116A, the second electrode 116B, the third electrode 116C, the fourth electrode 116D, the fifth electrode 116E, and the sixth electrode 116F are anodes. In some other embodiments, the first electrode 116A, the second electrode 116B, the third electrode 116C, the fourth electrode 116D, the fifth electrode 116E, and the sixth electrode 116F can be any other suitable electrodes.

In addition, the first electrode 116A, the second electrode 116B, the third electrode 116C, the fourth electrode 116D, the fifth electrode 116E, and the sixth electrode 116F are separated from each other.

Moreover, in some embodiments, the materials of the first electrode 116A, the second electrode 116B, the third electrode 116C, the fourth electrode 116D, the fifth electrode 116E and the sixth electrode 116F may include transparent conductive materials, for example, indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide material.

In some embodiments, the first electrode 116A, the second electrode 116B, the third electrode 116C, the fourth electrode 116D, the fifth electrode 116E and the sixth electrode 116F may be formed by CVD, sputtering, evaporation, or any other suitable method.

In addition, in some embodiments, the sixth electrode 116F is disposed above the first color filter portion 110A and corresponds to the first color filter portion 110A. The first electrode 116A is disposed above the second color filter portion 110B and corresponds to the second color filter portion 110B. The second electrode 116B is disposed above the third color filter portion 110C and corresponds to the third color filter portion 110C. The third electrode 116C is not disposed above any of the color filter layers 110 and does not correspond to any of the color filter layers 110. The fourth electrode 116D is disposed above the fourth color filter portion 110D and corresponds to the fourth color filter portion 110D. The fifth electrode 116E is disposed above the fifth color filter portion 110E and corresponds to the fifth color filter portion 110E.

In more detail, the first electrode 116A is disposed between the sixth electrode 116F and the second electrode 116B. The second electrode 116B is disposed between the first electrode 116A and the third electrode 116C. The third electrode 116C is disposed between the second electrode 116B and the fourth electrode 116D. The fourth electrode 116D is disposed between the third electrode 116C and the fifth electrode 116E.

In addition, in some embodiments, the first electrode 116A, the second electrode 116B, the third electrode 116C, the fourth electrode 116D, the fifth electrode 116E and the sixth electrode 116F are electrically isolated from one another.

Referring to FIG. 1, the third electrode 116C is disposed between the third color filter portion 110C and the fourth color filter portion 110D, and on the first middle part 114B and two inclined parts 114S of the recess surface 114 in accordance with some embodiments.

Referring to FIG. 1, in accordance with some embodiments, the display panel 100 further includes a second insulating layer 118 disposed on the first conductive layer 116. As shown in FIG. 1, the second insulating layer 118, from left to right, sequentially includes a ninth protrusion P9, a tenth protrusion P10, a first protrusion P1, a second protrusion P2, a third protrusion P3, a fourth protrusion P4, a fifth protrusion P5, a sixth protrusion P6, a seventh protrusion P7 and an eighth protrusion P8 in accordance with some embodiments.

Furthermore, in some embodiments, the material of the second insulating layer 118 may include acryl based rein, polyimide based resin, benzocyclobutene based resin, a combination thereof, or any other suitable material.

In addition, in some embodiments, a pixel definition material layer (not shown) may be formed by CVD, spin-on coating, sputtering, evaporation, or any other suitable method. Then, the ninth protrusion P9, the tenth protrusion P10, the first protrusion P1, the second protrusion P2, the third protrusion P3, the fourth protrusion P4, the fifth protrusion P5, the sixth protrusion P6, the seventh protrusion P7 and the eighth protrusion P8 may be formed by utilizing a multi-tone photomask. In more detail, the multi-tone photomask may be divided into a gray tone mask and a half tone mask. The gray tone mask forms seam portions that are below the resolution of exposure machines, and shield part of the light source by the seam portions to achieve semi-exposure effect. The half tone mask applies a translucent film to perform semi-exposure.

In addition, in some embodiments, the second electrode 116B includes a second pixel region 120B that is not covered by the second insulating layer 118. In more detail, a region of the second electrode 116B that is not covered by the second protrusion P2 and the third protrusion P3 is equivalent to the second pixel region 120B. That is to say, the region of the second electrode 116B exposed between the second protrusion P2 and the third protrusion P3 is equivalent to the second pixel region 120B.

In addition, in some embodiments, the third electrode 116C includes a third pixel region 120C that is not covered by the second insulating layer 118. In more detail, a region of the third electrode 116C that is not covered by the fourth protrusion P4 and the fifth protrusion P5 is equivalent to the third pixel region 120C. That is to say, the region of the third electrode 116C exposed between the fourth protrusion P4 and the fifth protrusion P5 is equivalent to the third pixel region 120C.

In addition, in some embodiments, the above-mentioned recess surface 114 corresponds to the third electrode 116C. In other words, the recess surface 114 is disposed under the third electrode 116C.

In addition, in some embodiments, the fourth electrode 116D includes a fourth pixel region 120D that is not covered by the second insulating layer 118. In more detail, a region of the fourth electrode 116D that is not covered by the sixth protrusion P6 and the seventh protrusion P7 is equivalent to the fourth pixel region 120D. That is to say, the region of the fourth electrode 116D exposed between the sixth protrusion P6 and the seventh protrusion P7 is equivalent to the fourth pixel region 120D.

In addition, in some embodiments, the fifth electrode 116E includes a fifth pixel region 120E that is not covered by the second insulating layer 118. In more detail, a region of the fifth electrode 116E that is not covered by the eighth protrusion P8 is equivalent to the fifth pixel region 120E. That is to say, the region of the fifth electrode 116E exposed from the eighth protrusion P8 is equivalent to the fifth pixel region 120E.

In addition, in some embodiments, the sixth electrode 116F includes a sixth pixel region 120F that is not covered by the second insulating layer 118. In more detail, a region of the sixth electrode 116F that is not covered by the ninth protrusion P9 is equivalent to the sixth pixel region 120F. That is to say, the region of the sixth electrode 116F exposed from the ninth protrusion P9 is equivalent to the sixth pixel region 120F.

Moreover, as shown in FIG. 1, the ninth protrusion P9 and the tenth protrusion P10 are disposed between the sixth electrode 116F and the first electrode 116A in accordance with some embodiments. The ninth protrusion P9 covers a portion of the sixth electrode 116F, and the tenth protrusion P10 covers a portion of the first electrode 116A.

Furthermore, in some embodiments, the first protrusion P1 and the second protrusion P2 are disposed between the first electrode 116A and the second electrode 116B. The first protrusion P1 covers a portion of the first electrode 116A, and the second protrusion P2 covers a portion of the second electrode 116B.

In addition, in some embodiments, the third protrusion P3 and the fourth protrusion P4 are disposed between the second electrode 116B and the third electrode 116C. The third protrusion P3 covers a portion of the second electrode 116B, and the fourth protrusion P4 covers a portion of the third electrode 116C.

In addition, in some embodiments, the fifth protrusion P5 and the sixth protrusion P6 are disposed between the third electrode 116C and the fourth electrode 116D. The fifth protrusion P5 covers a portion of the third electrode 116C, and the sixth protrusion P6 covers a portion of the fourth electrode 116D.

In addition, in some embodiments, the seventh protrusion P7 and the eighth protrusion P8 are disposed between the fourth electrode 116D and the fifth electrode 116E. The seventh protrusion P7 covers a portion of the fourth electrode 116D, and the eighth protrusion P8 covers a portion of the fifth electrode 116E.

Referring to FIG. 1 again, in accordance with some embodiments, the first electrode 116A includes a first pixel region 120A that is not covered by the second insulating layer 118. In more detail, a region of the first electrode 116A that is not covered by the tenth protrusion P10 and the first protrusion P1 is equivalent to the first pixel region 120A. That is to say, the region of the first electrode 116A exposed between the tenth protrusion P10 and the first protrusion P1 is equivalent to the first pixel region 120A.

Referring to FIG. 1, in accordance with some embodiments, the sixth electrode 116F corresponds to the first color filter portion 110A. That is to say, the sixth electrode 116F is disposed above the first color filter portion 110A.

In accordance with some embodiments, the first electrode 116A corresponds to the second color filter portion 110B. That is to say, the first electrode 116A is disposed above the second color filter portion 110B.

In accordance with some embodiments, the second electrode 116B corresponds to the third color filter portion 110C. That is to say, the second electrode 116B is disposed above the third color filter portion 110C.

In accordance with some embodiments, the fourth electrode 116D corresponds to the fourth color filter portion 110D. That is to say, the fourth electrode 116D is disposed above the fourth color filter portion 110D.

In accordance with some embodiments, the fifth electrode 116E corresponds to the fifth color filter portion 110E. That is to say, the fifth electrode 116E is disposed above the fifth color filter portion 110E.

In addition, the color filter layers 110 do not overlap with the third electrode 116C in view of the first direction S1. In other words, there is no color filter layer 110 disposed under the third electrode 116C. Therefore, the third pixel region 120C is a white light emitting region in some embodiments.

Referring to FIG. 1, in accordance with some embodiments, the display panel 100 further includes a display layer 122 disposed on the second insulating layer 118, the first electrode 116A, the second electrode 116B, the third electrode 116C, the fourth electrode 116D, the fifth electrode 116E, and the sixth electrode 116F. Moreover, in some embodiments, the display layer 122 is disposed on the second insulating layer 118, the first electrode 116A, the second electrode 116B, the third electrode 116C, the fourth electrode 116D, the fifth electrode 116E, and the sixth electrode 116F in a carpet covering manner.

In some embodiments, the display layer 122 is a single-layered structure that may be one of emitting layer (EML), hole injection layer (HIL), hole transport layer (HTL), electron injection layer (EIL) and electron transport layer (ETL). In some other embodiments, the display 122 may be a multi-layered structure that is made up of HIL, HTL, EIL, and ETL. In some other embodiments, the display layer 122 may be made up of EML, HIL, HTL, EIL, and ETL.

In some embodiments, the display layer 122 may be formed by CVD, spin-on coating, sputtering, evaporation or any other suitable method.

Referring to FIG. 1, in accordance with some embodiments, the display panel 100 further includes a second conductive layer 124 disposed on the display layer 122. In some embodiments, the second conductive layer 124 is disposed on the display layer 122 in a carpet covering manner. For example, in some embodiments, the second conductive layer 124 is a cathode. In some other embodiments, the second conductive layer 124 can be any other suitable electrode.

In some embodiments, the material of the second conductive layer 124 may be reflective metal material, for example, Ca, Na, Mg, Al, Ag, an alloy thereof, a combination thereof, or another metal material with conductivity and reflectivity. In some embodiments, the second conductive layer 124 may be formed by CVD, spin-on coating, sputtering, evaporation, or any other suitable method.

Referring to FIG. 1, in accordance with some embodiments, the second conductive layer 124 includes a first reflection portion 124A disposed between the first protrusion P1 and the second protrusion P2, and a second reflection portion 124B disposed between the third protrusion P3 and the fourth protrusion P4. As shown in FIG. 1, in accordance with some embodiments, a first distance D1 between the top surface 102S1 of the substrate 102 and the middle of the first reflection portion 124A in the first direction S1 is different from a second distance D2 between the top surface 102S1 of the substrate 102 and the middle of the second reflection portion 124B in the first direction S1. In the embodiments, the top surface 102S1 of the substrate 102 is merely used as a distance reference point. In some other embodiments, the bottom surface 102S2 of the substrate 102 may also be a distance reference point. That is to say, the distance between the bottom surface 102S2 of the substrate 102 and the first reflection portion 124A in the first direction S1 is also different from the distance between the bottom surface 102S2 of the substrate 102 and the second reflection portion 124B in the first direction S1. Preferably, the distance described in the present disclosure is the shortest distance between two objects unless directions are stated.

In more detail, in some embodiments, the third protrusion P3 is separated from the fourth protrusion P4. Therefore, the second reflection portion 124B disposed between the third protrusion P3 and the fourth protrusion P4 is disposed on the first insulating layer 112, instead of disposed on the third protrusion P3 or the fourth protrusion P4. Thus, the second reflection portion 124B is closer to the top surface 102S1 of the substrate 102. By comparison, the first protrusion P1 and the second protrusion P2 are overlapped with each other (or in contact with each other) and form a saddle. The saddle is opposite to the substrate 102, and includes two peaks that are in higher relative positions and a saddle portion disposed between the two peaks is in a lower relative position. The first reflection portion 124A disposed between the first protrusion P1 and the second protrusion P2 is disposed on the saddle portion of the saddle formed by the first protrusion P1 and the second protrusion P2. Therefore, the first reflection portion 124A is farther to the top surface 102S1 of the substrate 102.

Figure 2:
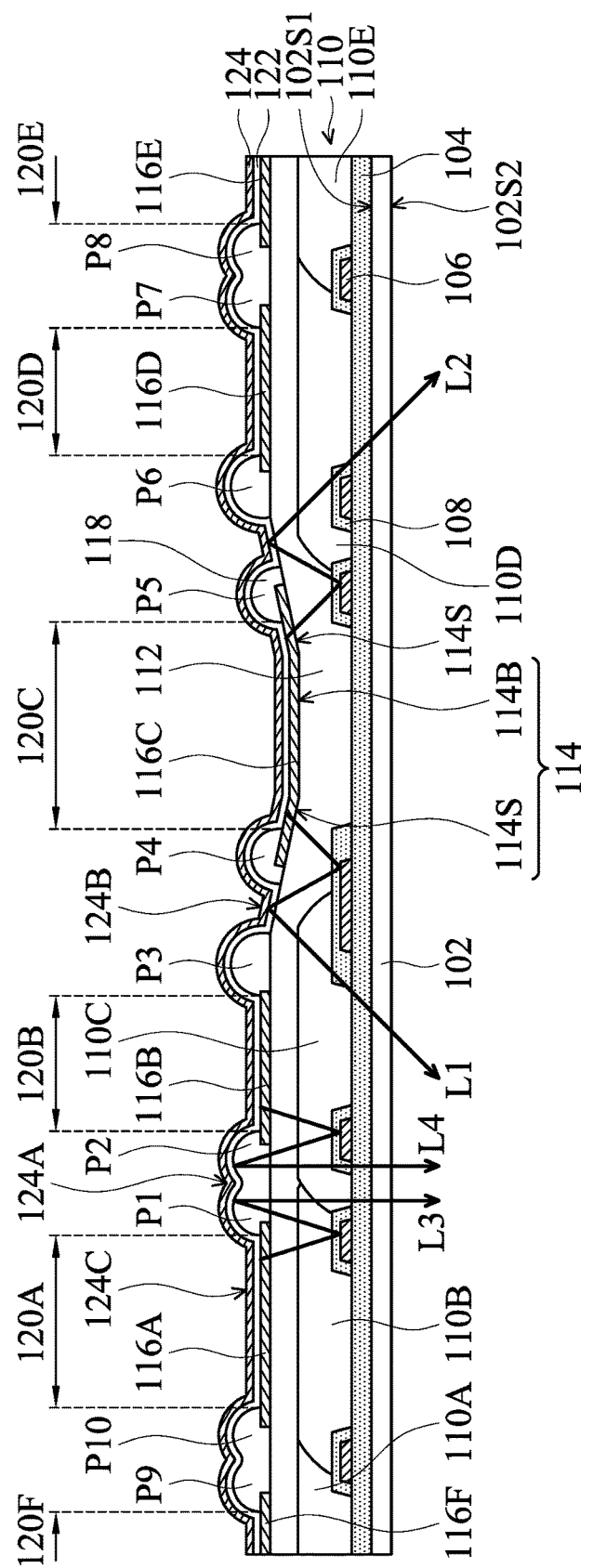
FIG. 2 is a cross-sectional view of a display panel in accordance with some embodiments.

Referring to FIG. 2, FIG. 2 is a cross-sectional view of the display panel 100 in accordance with some embodiments. As shown in FIG. 2, in accordance with some embodiments, the display layer 122 disposed on the inclined parts 114S of the recess surface 114 emits light L1 in the third pixel region 120C (which is a white light emitting region in some embodiments). The second reflection portion 124B disposed between the third pixel region 120C (which is a white light emitting region in some embodiments) and the third color filter portion 110C (or the second electrode 116B) may reflect the light L1 to the adjacent third color filter portion 110C. In comparison with the first reflection portion 124A disposed on the saddle formed by the first protrusion P1 and the second protrusion P2, the second reflection portion 124B is closer to the substrate 102. Therefore, the light-out path of the light L1 may be shortened, and the light use efficiency of the display panel 100 may increase.

Moreover, the second reflection portion 124B is disposed on the inclined parts 114S. Therefore, the reflection efficiency of the light L1 may further increase, and the light use efficiency of the display panel 100 may also increase.

In addition, in some embodiments, a configuration of the fifth protrusion P5 and the sixth protrusion P6 is the same as or similar to that of the third protrusion P3 and the fourth protrusion P4. That is, the fifth protrusion P5 is separated from the sixth protrusion P6. Therefore, in the third pixel region 120C, the light L2 emitted by the display layer 122 disposed on the inclined part 114S that is closer to the fourth pixel region 120D may also be effectively reflected to the fourth pixel region 120D, and the light use efficiency of the display panel 100 increases.

Furthermore, in some embodiments, the first protrusion P1 and the second protrusion P2 are disposed between the first electrode 116A and the second electrode 116B, and the third protrusion P3 and the fourth protrusion P4 are disposed between the second electrode 116B and the third electrode 116C. The first protrusion P1 is in contact with the second protrusion P2. Therefore, a color light L3 emitted from the first pixel region 120A towards the second pixel region 120B (that is a non-white light, e.g. green light, after passing through the second color filter portion 110B) may be reflected through the first reflection portion 124A disposed on the saddle and be closer to the first pixel region 120A. In addition, a color light L4 emitted from the second pixel region 120B towards the first pixel region 120A (that is a non-white light, e.g. blue light, after passing through the third color filter portion 110C) may be reflected through the first reflection portion 124A disposed on the saddle and be closer to the second pixel region 120B. Therefore, it may avoid mixing the color light L3 and the color light L4, and the display quality of the display panel 100 may increase.

In addition, as shown in FIG. 2, in accordance with some embodiments, a configuration of the ninth protrusion P9 and the tenth protrusion P10 is the same as or similar to that of the first protrusion P1 and the second protrusion P2. Therefore, the ninth protrusion P9 and the tenth protrusion P10 may also increase the display quality of the display panel 100.

In addition, as shown in FIG. 2, in accordance with some embodiments, a configuration of the seventh protrusion P7 and the eighth protrusion P8 is the same as or similar to that of the first protrusion P1 and the second protrusion P2. Therefore, the seventh protrusion P7 and the eighth protrusion P8 may also increase the display quality of the display panel 100.

Referring to FIG. 1 again, in some embodiments, the second conductive layer 124 further includes a third reflection portion 124C disposed corresponding to the first electrode 116A. A third distance D3 between the third reflection portion 124C and the top surface 102S1 of the substrate 102 in the first direction S1 is different from the first distance D1 between the middle of the first reflection portion 124A and the top surface 102S1 of the substrate 102. For example, in some embodiments, as shown in FIG. 1, the first distance D1 is greater than the third distance D3.

Referring to FIG. 1, in accordance with some embodiments, the first insulating layer 112 includes a first insulating portion 112A disposed corresponding to the second electrode 116B, and a second insulating portion 112B disposed corresponding to the third electrode 116C. The first insulating portion 112A has a first thickness T1 in the first direction S1, and the second insulating portion 112B has a second thickness T2. The first thickness T1 is different from the second thickness T2. For example, as shown in FIG. 1, the first thickness T1 is shorter than the second thickness T2. In addition, in some embodiments, the second insulating portion 112B of the first insulating layer 112 has the above-mentioned recess surface 114.

In addition, in some embodiments, the third color filter portion 110C is disposed corresponding to the first insulating portion 112A. In some other embodiments, one of red color filter portions, green color filter portions, and blue color filter portions is disposed corresponding to the first insulating portion 112A.

Figure 3:
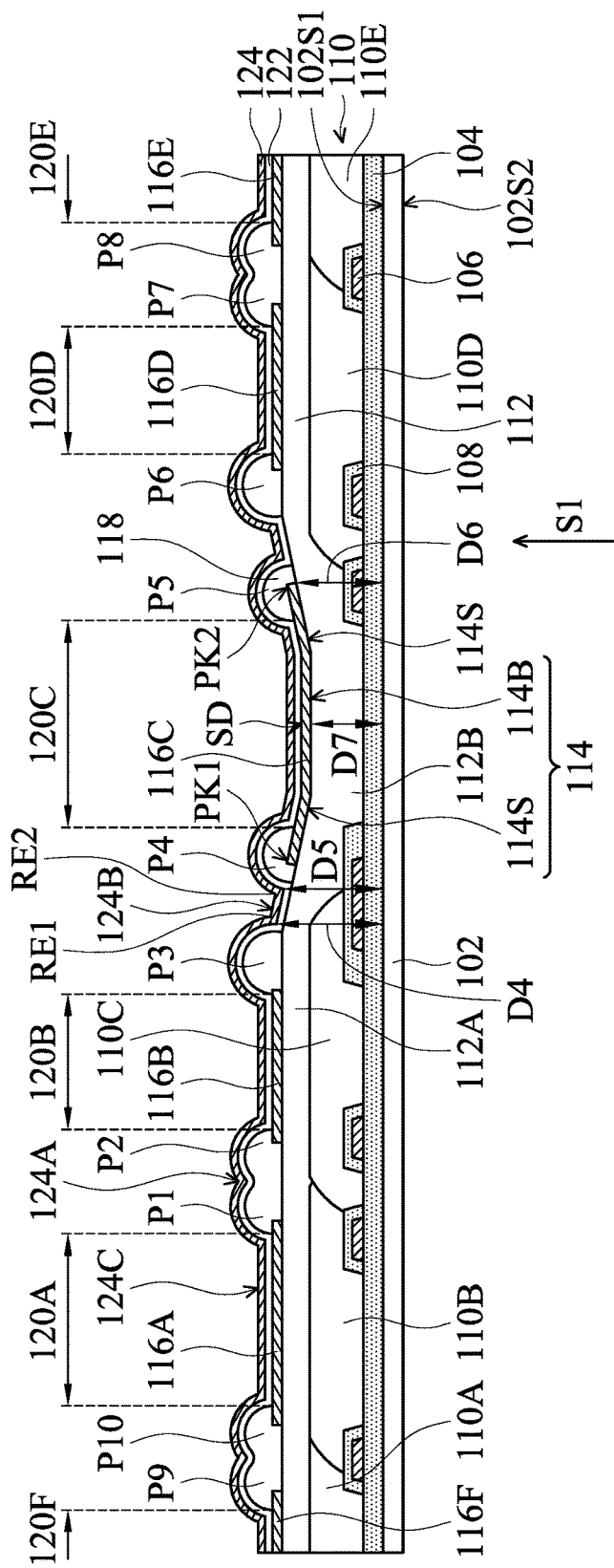
FIG. 3 is a cross-sectional view of a display panel in accordance with some embodiments.

Referring to FIG. 3, FIG. 3 is a cross-sectional view of the display panel 100 in accordance with some embodiments. As shown in FIG. 3, in accordance with some embodiments, the second reflection portion 124B includes a first end RE1 adjacent to the second electrode 116B, and a second end RE2 adjacent to the third electrode 116C. A fourth distance D4 between the first end RE1 and the top surface 102S1 of the substrate 102 is different from a fifth distance D5 between the second end RE2 and the top surface 102S1 of the substrate 102 in the first direction S1. For example, in some embodiments, as shown in FIG. 3, the fourth distance D4 is greater than the fifth distance D5.

In addition, as shown in FIG. 3, in accordance with some embodiments, the third electrode 116C includes a third end PK1, a fourth end PK2 and a second middle part SD disposed between the third end PK1 and the fourth end PK2. Moreover, in some embodiments, a sixth distance D6 from one of the third end PK1 and the fourth end PK2 to the top surface 102S1 of the substrate 102 in the first direction S1 is greater than a seventh distance D7 between the second middle part SD and the top surface 102S1 of the substrate 102 in the first direction S1.

It should be noted that the embodiments shown in FIGS. 1-3 are merely for illustration, and the scope of the present disclosure is not limited therein. Except for the embodiments shown in FIGS. 1-3, the fourth protrusion P4 and the fifth protrusion P5 of the embodiments of the present disclosure may also have another cross-sectional shape, as shown in embodiments of FIGS. 4-5. This part will be described in detail later. Therefore, the scope of the present disclosure is not limited to the embodiments shown in FIGS. 1-3.

It should be noted that the same or similar elements or layers in the above description and in the following paragraphs are designated the same or similar reference numerals, and the material, manufacturing methods and functions of the elements or layers in the following description are the same as or similar to that described before. Thus, those parts are not described again in the following paragraphs.

Figure 4:
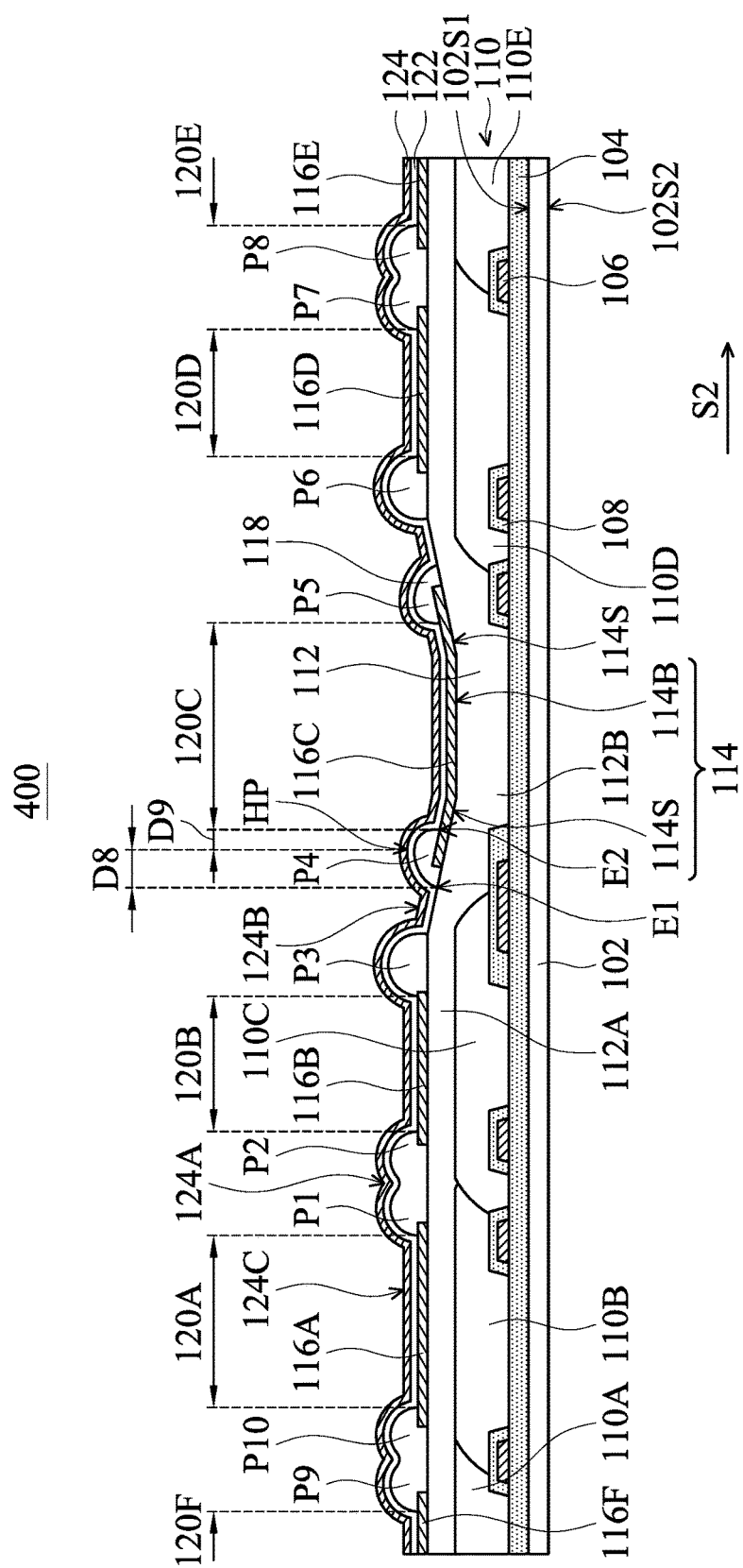
FIG. 4 is a cross-sectional view of a display panel in accordance with some other embodiments.

Referring to FIG. 4, FIG. 4 is a cross-sectional view of a display panel 400 in accordance with some other embodiments. As shown in FIG. 4, in accordance with some embodiments, the bottom of the fourth protrusion P4 has a fifth end E1 and a sixth end E2 that is opposite to the fifth end E1. The fifth end E1 is closer or adjacent to the second electrode 116B, and the sixth end E2 is closer or adjacent to the third electrode 116C. In addition, a surface of the fourth protrusion P4 has an apex HP. The apex HP is the farthest point on the surface of the fourth protrusion P4 to the top surface 102S1 of the substrate 102.

As shown in FIG. 4, in accordance with some embodiments, an eighth distance D8 between the apex HP of the fourth protrusion P4 and the fifth end E1 in a second direction S2 is different from a ninth distance D9 between the apex HP of the fourth protrusion P4 and the sixth end E2 in the second direction S2, wherein the second direction S2 is parallel to the top surface 102S1 or the bottom surface 102S2 of the substrate 102. For example, in some embodiments, as shown in FIG. 4, the eighth distance D8 is greater than the ninth distance D9.

In addition, as shown in FIG. 4, in accordance with some embodiments, the distances D8 and D9 are measured in a direction that is parallel to the top surface 102S1 or bottom surface 102S2 of the substrate 102. In more detail, the top surface of the substrate 102 has a normal vector, and the direction is perpendicular to the normal vector.

Furthermore, in some embodiments, the cross-sectional shape of the fifth protrusion P5 may be similar to or the same as that of the fourth protrusion P4, as shown in FIG. 4.

In some embodiments, the light use efficiency of the display panel 400 may increase further by making the fourth protrusion P4 and the fifth protrusion P5 have specific cross-sectional shapes.

Figure 5:
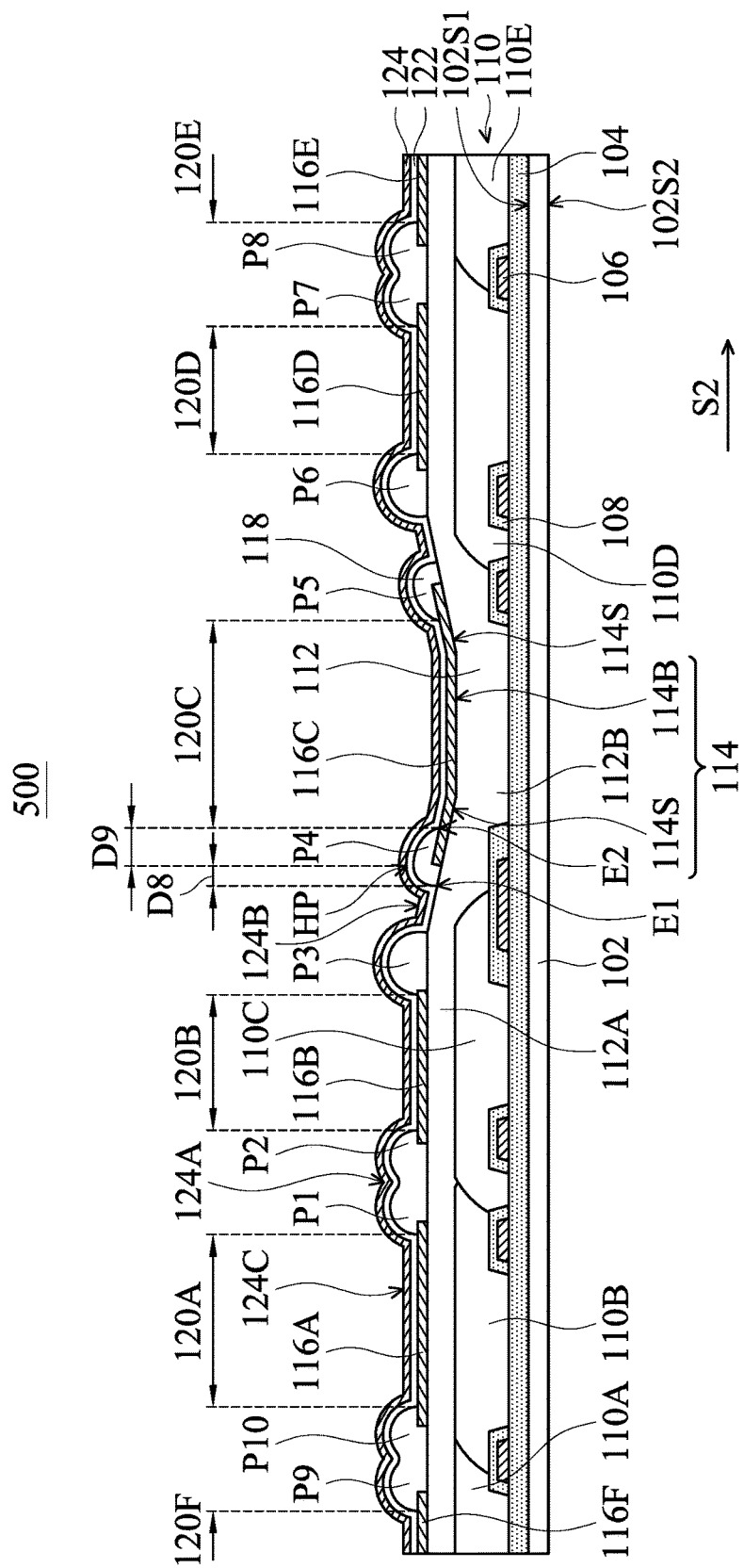
FIG. 5 is a cross-sectional view of a display panel in accordance with some other embodiments.

Referring to FIG. 5, FIG. 5 is a cross-sectional view of a display panel 500 in accordance with some other embodiments. As shown in FIG. 5, in accordance with some embodiments, the bottom of the fourth protrusion P4 has a fifth end E1 and a sixth end E2 that is opposite to the fifth end E1. The fifth end E1 is close or adjacent to the second pixel region 120B, and the sixth end E2 is close or adjacent to the third pixel region 120C. In addition, the surface of the fourth protrusion P4 has an apex HP. The apex HP is the farthest point on the surface of the fourth protrusion P4 to the top surface 102S1 of the substrate 102.

As shown in FIG. 5, in accordance with some embodiments, the distance between the apex HP of the fourth protrusion P4 and the fifth end E1 is the eighth distance D8, and the distance between the apex HP of the fourth protrusion P4 and the sixth end E2 is the ninth distance D9. The eighth distance D8 is different from the ninth distance D9. For example, in some embodiments, as shown in FIG. 5, the eighth distance D8 is less than the ninth distance D9.

In addition, as shown in FIG. 5, in accordance with some embodiments, the eighth distance D8 and the ninth distance D9 are measured in a direction that is parallel to the top surface 102S1 or bottom surface 102S2 of the substrate 102.

In addition, in some embodiments, the cross-sectional shape of the fifth protrusion P5 may be similar to or the same as that of the fourth protrusion P4, as shown in FIG. 5.

In some embodiments, the light use efficiency of the display panel 500 may be increased further by making the fourth protrusion P4 and the fifth protrusion P5 have specific cross-sectional shapes.

As described above, some embodiments of the present disclosure make the reflection portion of the cathode between the white light emitting region and the color filter layer closer to the substrate. Therefore, the light utilization efficiency of organic light-emitting diode displays can be increased. Moreover, some embodiments of the present disclosure make the reflection portion of the cathode between two color filter layers farther to the substrate, and that may avoid mixing color lights, and the display quality may increase.

It should be noted that the aforementioned sizes, parameters and shapes of the elements are not limitations of the present disclosure. Those skilled in the art may adjust these settings according to different needs. Moreover, the organic light-emitting diode displays and the methods for manufacturing the same of the present disclosure are not limited to the configurations shown in FIGS. 1-5. Some embodiments of the present disclosure may include any one or more features of any one or more embodiments of FIGS. 1-5. That is to say, not every feature of all the drawings should be performed at the same time in the organic light-emitting diode displays and the methods for manufacturing the same of the embodiments of the present disclosure.

While the present disclosure has been described by way of example and in terms of some embodiments, it is to be understood that those skilled in the art may make various changes, substitutions, and alterations to the present disclosure without departing from the spirit and scope of the present disclosure. For example, different features in different embodiments can mix together to form another embodiment of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure, as long as may be performed in the aforementioned embodiments and obtain substantially the same result may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A display panel, comprising:
a substrate including a surface, wherein a first direction is perpendicular to the surface;
a color filter layer disposed on the surface of the substrate;
a first insulating layer disposed on the color filter layer;
a first conductive layer disposed on the first insulating layer, and the first conductive layer comprising a first electrode, a second electrode and a third electrode, wherein the second electrode is disposed between the first electrode and the third electrode, and the first electrode, the second electrode, and the third electrode are separated from each other;
a second insulating layer disposed on the first conductive layer, and the second insulating layer comprising a first protrusion, a second protrusion, a third protrusion and a fourth protrusion, wherein the first protrusion and the second protrusion are disposed between the first electrode and the second electrode, and the third protrusion and the fourth protrusion are disposed between the second electrode and the third electrode;
a display layer disposed on the second insulating layer; and
a second conductive layer disposed on the display layer, and the second conductive layer comprising a first reflection portion and a second reflection portion, wherein the first reflection portion is disposed between the first protrusion and the second protrusion, and the second reflection portion is disposed between the third protrusion and the fourth protrusion,
wherein a first distance between the first reflection portion and the surface of the substrate in the first direction is different from a second distance between the second reflection portion and the surface of the substrate in the first direction.

2. The display panel as claimed in claim 1, wherein the first protrusion is in contact with the second protrusion.

3. The display panel as claimed in claim 1, wherein the second conductive layer further comprises a third reflection portion which is disposed corresponding to the first electrode, wherein a third distance between the third reflection portion and the surface of the substrate in the first direction is different from the first distance.

4. The display panel as claimed in claim 1, wherein the color filter layer comprises a red color filter portion, a green color filter portion and a blue color filter portion, the first electrode is disposed corresponding to one of the red color filter portion, the green color filter portion and the blue color filter portion, and the second electrode is disposed corresponding to another one of the red color filter portion, the green color filter portion and the blue color filter portion.

5. The display panel as claimed in claim 1, wherein the third protrusion is separated from the fourth protrusion.

6. The display panel as claimed in claim 1, wherein the first insulating layer comprises a first insulating portion and a second insulating portion, the first insulating portion is disposed corresponding to the second electrode, and the second insulating portion is disposed corresponding to the third electrode, the first insulating portion has a first thickness in the first direction, the second insulating portion has a second thickness in the first direction, and the first thickness is different from the second thickness.

7. The display panel as claimed in claim 6, wherein the second insulating portion includes a recess surface corresponding to the third electrode, the recess surface comprises a first middle part and an inclined part disposed at one side of the first middle part, and the third electrode is disposed corresponding to the first middle part and the inclined part.

8. The display panel as claimed in claim 6, wherein the color filter layer comprises a red color filter portion, a green color filter portion and a blue color filter portion, and one of the red color filter portion, the green color filter portion and the blue color filter portion is disposed corresponding to the first insulating portion.

9. The display panel as claimed in claim 1, wherein the second reflection portion comprises a first end and a second end, the first end is located adjacent to the second electrode, the second end is located adjacent to the third electrode, wherein a fourth distance between the first end and the surface of the substrate in the first direction is different from a fifth distance between the second end and the surface of the substrate in the first direction.

10. The display panel as claimed in claim 1, wherein the third electrode comprises a third end, a fourth end and a second middle part disposed between the third end and the fourth end, wherein a sixth distance between one of the third end and the fourth end and the surface of the substrate in the first direction is greater than a seventh distance between the second middle part and the surface of the substrate in the first direction.

11. The display panel as claimed in claim 1, wherein the first conductive layer further comprises a fourth electrode disposed on the first insulating layer, and the third electrode is disposed between the second electrode and the fourth electrode.

12. The display panel as claimed in claim 11, wherein the second insulating layer comprises a fifth protrusion and a sixth protrusion, the fifth protrusion and the sixth protrusion are disposed between the third electrode and the fourth electrode, and the fifth protrusion is separated from the sixth protrusion.

13. The display panel as claimed in claim 11, wherein the first electrode, the second electrode, the third electrode and the fourth electrode are electrically isolated.

14. The display panel as claimed in claim 1, wherein the fourth protrusion has a fifth end and a sixth end opposite to the fifth end, an eighth distance between an apex of the fourth protrusion and the fifth end in a second direction is different from a ninth distance between the apex of the fourth protrusion and the sixth end in the second direction, and the second direction is parallel to the surface of the substrate.

15. The display panel as claimed in claim 14, wherein the fifth end is located adjacent to the second electrode, and the sixth end is located adjacent to the third electrode.

16. The display panel as claimed in claim 15, wherein the eighth distance is greater than the ninth distance.

17. The display panel as claimed in claim 15, wherein the eighth distance is less than the ninth distance.

18. The display panel as claimed in claim 1, wherein the color filter layer does not overlap the third electrode in view of the first direction.

* * * * *